US006365333B2

(12) United States Patent
Forbes et al.

(10) Patent No.: US 6,365,333 B2
(45) Date of Patent: Apr. 2, 2002

(54) LOW TEMPERATURE ANTI-REFLECTIVE COATING FOR IC LITHOGRAPHY

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/907,339

(22) Filed: Jul. 17, 2001

Related U.S. Application Data

(60) Continuation of application No. 09/642,956, filed on Aug. 21, 2000, now Pat. No. 6,261,751, which is a division of application No. 09/002,732, filed on Jan. 5, 1998, now Pat. No. 6,117,619.

(51) Int. Cl.[7] .......................... G03C 1/815; G03C 1/825
(52) U.S. Cl. ...................................... 430/510; 430/512
(58) Field of Search ................... 430/311, 313, 430/327, 510, 512, 950

(56) References Cited

U.S. PATENT DOCUMENTS

| 5,227,333 A | | 7/1993 | Shepard ..................... 437/189 |
| 5,332,653 A | | 7/1994 | Cullen et al. ............... 430/323 |
| 5,378,659 A | | 1/1995 | Roman et al. .............. 437/229 |
| 6,117,619 A | * | 9/2000 | Forbes et al. ............... 430/313 |
| 6,261,751 B1 | * | 7/2001 | Forbes et al. ............... 430/510 |

OTHER PUBLICATIONS

Cirelli, R., et al., "A Multilayer Inorganic Antireflective System for use in 248 nm Deep Ultraviolet Lithography", *J. Vac. Sci. Technol. B*, 14, 4229–4233, (Nov./Dec. 1996).

Dammel, R.R., et al., "Modeling of Bottom Anti–Reflection Layers: Sensitivity to Optical Constants (Photolithography)", *Proc. SPIE*, vol. 2724, 754–69, (1996).

Dijkstra, et al., "Optimization of Anti–Reflection Layers for Deep UV Lithography", *SPIE Optical/ Laser Microlithography VI*, vol. 1927, 275–86, (1993).

Hurley, P., et al., "Low Temperature Plasma Oxidation of Polycrystalline Silicon", *Proc. 7th European Conf. on Insulating Films on Semiconductors: Contributed Papers*, Section 5, IOP Publishing Ltd., 235–238, (1991).

King, T., et al., "Deposition and Properties of Low–Pressure Chemical–Vapor Deposited Polycrystalline Silicon–Germanium Films", *J. Electrochemical Society*, 141, 2235–2241, (Aug. 1994).

Li, P., et al., "Formation of Stoichiometric SiGe Oxide by Electron Cyclotron Resonance Plasma", *Appl. Phys. Lett*, 60, 3265–3267, (Jun. 1992).

Mohajerzadeh, S., et al., "A Low–Temperature Ion Vapor Deposition Technique for Silicon and Silicon–Germanium Epitaxy", *Canadian J. Physics*, 74, S69–S73, (1996).

Mohri, M., et al., "Effect of SiF(4)/SiH(4)/H(2) Flow Rates on Film Properties of Low–Temperature Polycrystalline Silicon Films Prepared by Plasma Enhanced Chemical Vapor Deposition", *IEICE Transactions on Electronics*, E77–C, 1677–1684, (Oct. 1994).

Mukhopadhyay, M., et al., "Properties of SiGe Oxides Grown in a Microwave Oxygen Plasma", *J. Applied Physics*, 78, 6135–6140, (Nov. 1995).

Ogawa, T., et al., "Advantages of a SiOxNy: H Anti–Reflective Layer for ArF Excimer Laser Lithography", *Japanese J. Applied Physics*, 35, 6360–6365, (1996).

* cited by examiner

*Primary Examiner*—Christopher G. Young
(74) *Attorney, Agent, or Firm*—Schwegman, Lundberg, Woessner & Kluth, P.A.

(57) ABSTRACT

An antireflective coating (ARC) or antireflective layer (ARL) is interposed between a photoresist layer and an underlying substrate. The ARC includes an optically absorptive polysilicon germanium or polysilicon first layer, deposited by low pressure chemical vapor deposition (LPCVD). An optically transmissive second layer is grown on the first layer by oxidizing it at low temperature. The low temperature oxidation accurately controls the thickness, and optical impedance, of the second layer. The optical impedances of the second and photoresist layers are matched for minimizing reflections and reducing photolithographic limitations such as swing effect and reflective notching. The low temperature oxidation is compatible with low thermal budget layers (e.g., aluminum or other metals), which are typically highly reflective at ultraviolet (UV) and deep ultraviolet (DUV) lithographic exposure wavelengths.

32 Claims, 1 Drawing Sheet

LOW TEMPERATURE ANTI-REFLECTIVE COATING FOR IC LITHOGRAPHY

This application is a Continuation of U.S. application Ser. No. 09/642,956, filed Aug. 21, 2000, now U.S. Pat. No. 6,261,751, which is a Divisional of U.S. application Ser. No. 09/002,732, filed Jan. 5, 1998, now U.S. Pat. No. 6,117,619.

CROSS-REFERENCE TO RELATED APPLICATIONS

This application is related to commonly assigned patent application of Forbes et al., U.S. patent application Ser. No. 08/958,023 entitled "ANTI-REFLECTIVE COATING FOR IC LITHOGRAPHY," filed on Oct. 27, 1997, which disclosure is incorporated herein by reference.

TECHNICAL FIELD OF THE INVENTION

This invention relates generally to integrated circuits, and particularly, but not by way of limitation, to a low temperature anti-reflective coating for integrated circuit lithography.

BACKGROUND OF THE INVENTION

Trends in modem integrated circuit (IC) technology demand increasingly dense ICs, such as for computer systems, portable electronics, and telecommunications products. IC fabrication includes, among other things, photolithography for selective patterning and etching of photoresist layers. The patterned photoresist layer serves as a masking layer such that a subsequent IC processing step is carried out on only those portions of the underlying IC that are uncovered by photoresist, as described below.

A photoresist layer is typically formed on an underlying integrated circuit substrate. The photoresist layer overlays any structures that are already formed on the substrate. Portions of the photoresist are selectively exposed to light through a lithographic mask that includes clear and opaque portions forming a desired pattern. Light is transmitted through the clear portions of the mask, but not through the opaque portions. The incident light changes the chemical structure of the exposed portions of photoresist. A chemical etchant, which is sensitive to only one of the exposed and unexposed portions of the photoresist, is applied to the photoresist to selectively remove those portions of the photoresist to which the chemical etchant is sensitive. As a result, portions of the photoresist which are insensitive to the chemical etchant remain on the IC. The remaining portions of the photoresist protect corresponding underlying portions of the IC from a subsequent IC processing step. After this IC processing step, the remaining portions of the photoresist layer are typically removed from the IC.

High density ICs require sharply defined photoresist patterns, because these patterns are used to define the locations (and density) of structures formed on the IC. However, light reflects from the surface of the underlying substrate on which the photoresist is formed. Certain structures that are formed on the underlying substrate are highly reflective such as, for example, aluminum or copper layers for forming circuit interconnections. Reflections from the surface of the substrate underlying the photoresist causes deleterious effects that limit the resolution of photolithographic photoresist patterning, as described below.

First, reflections cause the light to pass through the photoresist at least twice, rather than only once. In other words, light first passes through the photoresist to reach the surface of the underlying substrate. Then, light is reflected from the surface of the underlying substrate and passes back through the photoresist layer a second time. The chemical structure of the photoresist changes differently when light passes through the photoresist more than once, rather than when light passes through the photoresist only once. A portion of the light, already reflected from the surface of the underlying substrate, can also reflect again from the surface of the photoresist, passing back through the photoresist yet again. In fact, standing light waves can result in the photoresist from superpositioning of incident and reflected light rays. This overexposure problem is sometimes referred to as the "swing effect."

Even more problematic, the reflections of the light are not necessarily perpendicular. Light reflects angularly from features on the surface of the underlying substrate, or if the incident light is not perpendicular to the surface of the substrate. The latter results from the diffractive nature of light (i.e., light bends). Off-angle reflections reduce the sharpness of the resulting photoresist pattern. A portion of the light reflected obliquely from the surface of the underlying substrate can also be again reflected obliquely from the surface of the photoresist. As a result of such angular reflections, the light can travel well outside those photoresist regions underlying the transmissive portions of the photolithographic mask. This potentially causes photoresist exposure well outside those photoresist regions underlying transmissive portions of the photolithographic mask. This problem, which is sometimes referred to as "notching," results in a less sharply defined photoresist pattern that limits the density of structures formed on the integrated circuit. There is a need to overcome these photolithographic limitations to obtain the benefits of high resolution photolithography and high density integrated circuits.

As discussed above, aluminum and other metallization layers are particularly problematic for high resolution lithography. In addition to being highly reflective, such layers typically have a low thermal budget More particularly, after an aluminum or other metallization layer is formed, only low temperature processing steps can be used, in order to avoid vaporizing the aluminum or metallization layer. Thus, there is a particular need to avoid reflections from metal layers that are both highly reflective and incompatible with subsequent high temperature processes.

SUMMARY OF THE INVENTION

The present invention provides, among other-things, an antireflective coating (ARC), such as for use in integrated circuit (IC) photolithography. In one. embodiment, the invention provides an antireflective coating. The antireflective coating includes a first layer formed on a substrate and having a first optical impedance. The antireflective coating also includes a second layer formed on the first layer and having a second optical impedance. The second layer has a thickness that is determined by a grown oxidation of the first layer.

In one embodiment, the first layer comprises polysilicon germanium, and the second layer comprises an oxide that is grown from the polysilicon germanium material of the first layer. In another embodiment, the first layer comprises polysilicon, and the second layer comprises an oxide that is grown from the polysilicon material of the first layer.

In one embodiment, the second layer is substantially transmissive of a wavelength of incident light, wherein the wavelength is ultraviolet (UV) or deep ultraviolet (DUV), and the first layer is substantially absorptive of the wavelength of incident light. According to one aspect of the invention, a thickness of the second layer is less than or equal to approximately ¼ of the wavelength of the incident light. According to another aspect of the invention, a thickness of the first layer is greater than or equal to a thickness that absorbs substantially all of the incident light received by the first layer.

The second layer receives a photoresist layer formed thereupon. The photoresist layer has a photoresist optical impedance. The second optical impedance is approximately equal to the photoresist optical impedance at an interface between the second and photoresist layers.

Another aspect of the invention provides, among other things, a method. A first layer, having a first optical impedance, is formed on an integrated circuit substrate. A second layer, having a second optical impedance, is grown on the first layer. A photoresist layer, having a photoresist optical impedance, is formed on the second layer. The photoresist layer is exposed to incident light having a wavelength. Substantially all of any of the incident light that is received by the first layer is absorbed therein.

In one embodiment, the invention provides a method in which a first layer is deposited on an integrated circuit substrate using chemical vapor deposition. The first layer has a first optical impedance and is substantially absorptive to incident light having a wavelength in one of the ultraviolet (UV) and deep ultraviolet (DUV) ranges. A second layer is formed by oxidizing the first layer at a temperature of less than approximately 300 degrees Celsius. The second layer has a second optical impedance that depends on its thickness. The second layer is substantially transmissive of incident light having a wavelength in one of the UV and DUV ranges. A photoresist layer is formed on the second layer, and exposed to incident light having a wavelength in one of the UV and DUV ranges. In this embodiment, an oxidation time is adjusted to obtain a thickness of the second layer that approximately matches the second and photoresist optical impedances.

Thus, the present invention provides, among other things, an antireflective coating (ARC), such as for use in integrated circuit lithography. The antireflective coating is interposed between a photoresist layer and an underlying substrate. One aspect of the present invention matches an optical impedance at the interface between the antireflective coating and the photoresist, thereby minimizing reflections. The antireflective coating includes an optically absorptive first layer, and an optically transmissive overlying second layer. The second layer is formed by oxidizing the first layer at low temperatures. This provides better control over the thickness of the second layer, the effective optical impedance of the antireflective coating, and results in better matching between the second layer and photoresist optical impedances. This, in turn, minimizes reflections from the interface between the second and photoresist layers. Substantially all incident light is that reaches the first layer is absorbed therein. As a result, substantially no light reaches the potentially highly reflective underlying substrate.

The present invention reduces swing effect and notching, thereby allowing higher resolution photolithography and higher density integrated circuits. The present invention can be formed at low temperatures. As a result, the antireflective coating is particularly compatible with underlying aluminum or metal interconnection layers. Such layers are particularly reflective and have a low thermal budget. The present invention is also compatible with the ultraviolet (UV) and deep ultraviolet (DUV) photolithographic exposure wavelengths required for high resolution photolithography. Other advantages will also become apparent upon reading the following detailed description of the invention.

BRIEF DESCRIPTION OF THE DRAWINGS

In the drawings, like numerals describe substantially similar components throughout the several views.

DETAILED DESCRIPTION OF THE INVENTION

Figure 1:
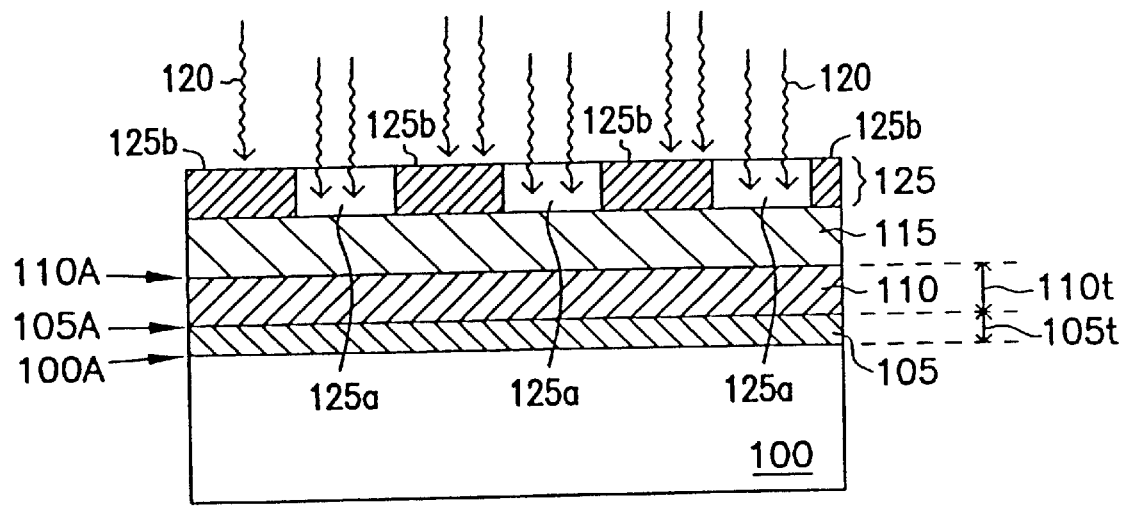
FIG. 1 is a cross-sectional view illustrating generally one embodiment of antireflective techniques according to the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention provides, among other things, an antireflective coating (ARC), such as for use in IC photolithography. The antireflective coating is interposed between a photoresist layer and an underlying substrate. One aspect of the present invention matches an optical impedance at the interface between the antireflective coating and the photoresist. Substantially all incident light received by the antireflective coating is absorbed in the antireflective coating. As a result, substantially no light reaches the potentially highly reflective underlying substrate. Moreover, since the antireflective coating is formed using low temperature process steps, it is compatible for use with underlying metal (e.g., aluminum, copper, etc.) layers. Such metal layers are particularly reflective and cannot withstand high temperature processing.

The present invention reduces swing effect and notching, thereby allowing higher resolution photolithography and higher density integrated circuits. The present invention is also compatible with the ultraviolet (UV) and deep ultraviolet (DUV) photolithographic exposure wavelengths required for high resolution photolithography. In this application, DUV includes those wavelengths that are less than or equal to approximately 254 nanometers (e.g., including 193 nanometers, 248 nanometers, and other wavelengths). UV includes those wavelengths in the approximate range of 313 nanometers (e.g., up to near-UV wavelengths of approximately 450 nanometers and down to the DUV wavelengths of approximately 254 nanometers). However, it is understood that the present invention is not limited to UV and DUV exposure wavelengths. The invention also includes the use of any other exposure wavelengths. Other advantages will also become apparent upon reading the following detailed description of the invention.

Minimizing Reflections at Photoresist Interface

FIG. 1 is a cross-sectional view illustrating generally, by way of example, but not by way of limitation, one embodiment of antireflective techniques according to the present invention. In FIG. 1, substrate 100 includes any wafer or substrate, including any topology or structures previously fabricated thereupon, such as transistors or other circuit elements, interconnection lines (e.g., aluminum, copper, refractory metals, or other conductive material), insulators for isolating circuit elements or interconnection lines, semiconductor structures, or any other integrated circuit component. First layer 105 and second layer 110 together form a backside antireflective coating (ARC), also referred to as an antireflective layer (ARL), which is interposed between substrate 100 and photoresist layer 115. Second layer 110 is grown by oxidizing first layer 105, as described below. Photoresist layer 115 is formed on a working surface 110A of second layer 110. Photoresist layer 115 is selectively exposed to incident light 120 using a photolithographic mask 125 overlying photoresist layer 115. Mask 125 includes a pattern of transmissive (clear) portions 125A and absorptive (opaque) portions 125B, which are characterized as transmissive or absorptive for a particular wavelength of the incident light 120.

The antireflective coating formed by first layer 105 and second layer 110 decreases reflections of incident light 120 from substrate 100 back into photoresist layer 115. Such reflections result in reduced-definition exposure of the photoresist layer 115 (e.g., swing effect and notching), as described above. Higher density ICs require improved photolithographic resolution. Improved photolithographic resolution, in turn, requires shorter wavelengths of incident light 120 in order to limit diffractive effects. However, shorter wavelengths of incident light 120, such as ultraviolet (UV) and deep ultraviolet (DUV) wavelengths, typically result in increased reflection from the working surface 100A of underlying substrate 100 when conventional photolithographic techniques are used. Moreover, certain substrate materials, such as aluminum, copper, and other interconnection conductors, are highly reflective to incident UV and DUV light.

According to one aspect of the present invention, as described below, first and second layers 105 and 110, respectively, minimize reflection of incident light 120 back into the photoresist layer 115 from the surface 110A of second layer 110. Moreover, incident light 120 that is transmitted through substantially transmissive second layer 110, such that it reaches into absorptive first layer 105, is substantially absorbed in first layer 105. As a result, incident light 120 does not reach the surface 100A of reflective substrate 100, and is not reflected therefrom.

According to another aspect of the present invention, reflections from surface 110A of second layer 110 are minimized by matching, at surface 110A, an optical impedance $Z_{110}$ of second layer 110, to a respective optical impedance $Z_{115}$ of photoresist layer 115. A magnitude of reflection coefficient $K_{110A}$ at surface 110A is illustrated by Equation 1.

$$|K_{110A}| = \left|\frac{Z_{110} - Z_{115}}{Z_{110} + Z_{115}}\right| \tag{1}$$

In Equation 1, $K_{110A}$ is the reflection coefficient at surface 110A, $Z_{110}$ is the optical impedance of second layer 110 at surface 110A, and $Z_{115}$ is the optical impedance of photoresist layer 115 adjacent to surface 110A. According to one of the invention, the optical impedance $Z_{110}$ of second layer 110 is complex-valued (i.e., having both real and imaginary parts, Z=R+jX), allowing easier matching to the optical impedance $Z_{115}$ of photoresist layer 115, which is typically also complex-valued for common photoresist layer 115 materials. As the numerator of Equation 1 indicates, better matching of $Z_{110}$ and $Z_{115}$ at surface 110A allows minimization of the magnitude of the reflection coefficient $K_{110A}$ at surface 110A. This minimizes reflections of incident light 120 at surface 110A that cause swing effect and notching.

In one example of the present invention, each of the real and imaginary parts of $Z_{110}$ and $Z_{115}$ are matched to respective real and imaginary parts of the other of $Z_{110}$ and $Z_{115}$ at surface 110A. In another example of the present invention, the magnitudes of the complex-valued optical impedances $Z_{110}$ and $Z_{115}$ are matched to each other at the surface 110A. Alternatively, only the real parts of the optical impedances $Z_{110}$ and $Z_{115}$ (i.e., the optical absorptivities) are matched to each other at surface 110A.

According to another aspect of the invention, the optical impedance $Z_{110}$ of second layer 110 substantially exceeds the optical impedance $Z_{105}$ of first layer 105. The effective optical impedance at surface 110A, looking toward substrate 100, is the optical impedance $Z_{110}$ when terminated by $Z_{105}$. In this embodiment, since $Z_{105}$ is negligible in comparison with $Z_{110}$ the effective optical impedance at surface 110A, looking toward substrate 100, is approximately equal to the optical impedance $Z_{110}$ of second layer 110, when as if terminated by a short circuit, or a very small impedance $Z_{105}$.

Second Layer Thickness and Optical Impedance

According to one aspect of the invention, a thickness 110t of second layer 110 is selected to obtain a desired optical impedance Z∠that approximately matches the photoresist optical impedance $Z_{115}$. According to another aspect of the invention, second layer 110 is formed by oxidation of first layer 105. The exact thickness 110t is adjusted by, among other things, adjusting the oxidation time. Alternatively, other process conditions (e.g., ambient temperature) are adjusted to obtain the desired thickness 110t. Because oxidation offers relatively precise control over the resulting thickness 110t of second layer 110, it also obtains relatively precise control over tee resulting optical impedance $Z_{110}$. This, in turn, allows good matching of $Z_{110}$ and $Z_{115}$, thereby minimizing reflections at the surface 110A.

Figure 2:
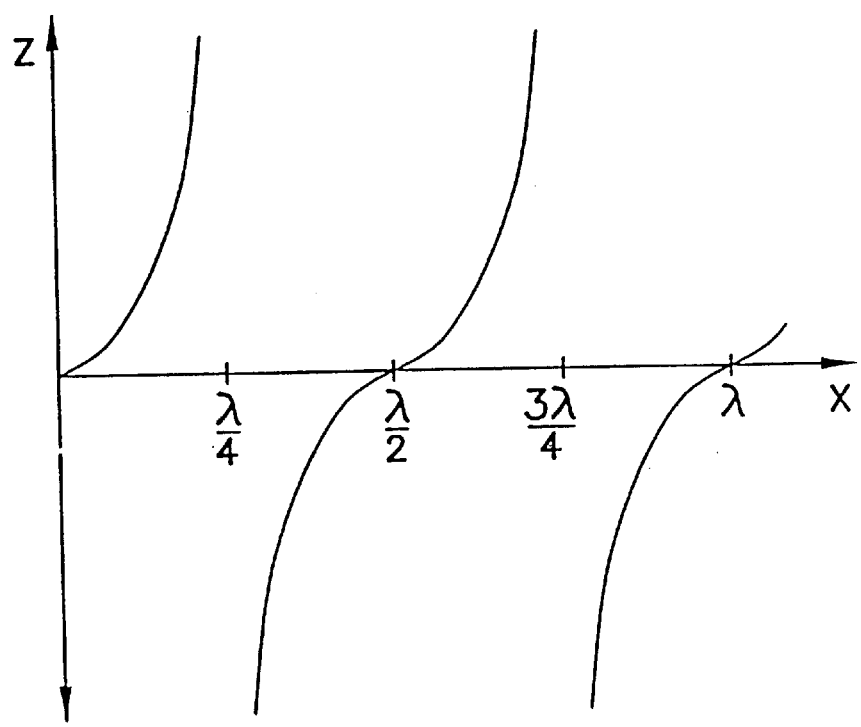
FIG. 2 is a generalized graph of optical impedance (Z) vs. distance (x), where distance x is expressed in terms of a wavelength ($\lambda$) of incident light.

FIG. 2 is a generalized graph of optical impedance (Z) vs. distance (x), where distance (x) is expressed in terms of the wavelength (λ) of the incident light 120, for a layer that is terminated by or disposed over a strongly absorbing underlying layer. As illustrated in FIG. 2, a complete range of optical impedances $Z_{110}$ is obtainable in second layer 110. The complete range of optical impedances $Z_{110}$ is repeated in second layer 110 at intervals of ¼ wavelength of the incident light 120. Moreover, sign-changes in the optical impedance $Z_{110}$ exist at ¼ wavelength intervals, and discontinuities in the optical impedance $Z_{110}$ exist at ½ wavelength intervals. By appropriate selection of the thickness Not of second layer 110, the present invention accurately matches the optical impedance $Z_{110}$ of second layer 110 to the optical impedance $Z_{115}$ in photoresist layer 115 at surface 110A for a photoresist layer 115 of any material and optical impedance $Z_{115}$.

In one embodiment, for example, the thickness 110t of second layer 110 is less than or equal to ¼ of the wavelength of the incident light 120, since a complete range of optical impedances $Z_{110}$ is obtainable within that distance. For example, in one embodiment, the thickness 110t of second layer 110 is approximately less than or equal to 425 angstroms (e.g., 50 Å, 100 Å, 150 Å, 200 Å, 250 Å, 300 Å, 350 Å, 400 Å). A thickness 110t that is less than or equal to 425 angstroms is less than or equal to ¼ of the wavelength of incident light 120 when the incident light 120 includes wavelengths exceeding 170 nanometers in oxide second layer 110. A wavelength of approximately 170 nanometers in oxide second layer 110 corresponds to a wavelength of approximately 248 nanometers in air. This includes both UV and DUV wavelengths of incident light 120.

Another embodiment of the present invention, however, uses a thickness of second layer 110 that exceeds ¼ wavelength of the incident light 120. Since a complete range of magnitudes of optical impedances $Z_{110}$ is available in each ¼ wavelength interval, the thickness of second layer 110 can also exceed ¼ wavelength of incident light 120, as seen in FIG. 2, while still providing the desired impedance matching properties at surface 110A. If process constraints make it difficult to obtain the desired thickness 110t of second layer 110 that is less than ¼ wavelength of the incident light 120, a thickness 110t that is between ¼ and ½ of the wavelength of the incident light 120, for example, is used instead. Similarly, if process constraints make it difficult to obtain the desired thickness 110t of second layer 110 that is less than ½ wavelength of the incident light 120, a thickness 110t that is between ½ and ¾ of the wavelength of the incident light 120, for example, is used instead.

First Layer Thickness and Optical Impedance

According to one aspect of the invention, the thickness 105t of first layer 105 is selected such that any incident light 120 received by first layer 105 is substantially absorbed or extinguished therein. According to another aspect of the invention, second layer 110 is formed by oxidation of first layer 105. Oxidation of first layer 105 consumes a portion of the originally formed thickness of first layer 105. Accordingly, FIG. 1 illustrates the thickness 105t remaining after oxidation of first layer 105 to form second layer 110.

In one embodiment, the present invention provides a strongly absorptive first layer 105 that is thick enough to substantially absorb all of the UV or DUV incident light 120 that reaches first layer 105, as described below. This prevents any reflections from surface 100A of underlying substrate 100, which is potentially highly reflective. The exact thickness 105t of first layer 105 varies according to, among other things, the wavelength of the incident light 120, the degree of optical absorption expected in overlying second layer 110, the degree of optical absorption expected in first layer 105, and the desired degree to which the incident light 120 is extinguished in first layer 105. In one example, thickness 105t is large enough to absorb 95% of the incident light 120 that penetrates into first layer 105. In other embodiments, the thickness 105t is selected for a different degree of absorption (e.g., 25%, 50%, 75%, 99%, etc). In one example, first layer 105 has a thickness 105t that is greater than or equal to a value approximately between 100 angstroms to 200 angstroms. If a lesser degree of antireflective protection is required, then less optical absorption in first layer 105 is required, and strongly absorptive first layer 105 can have a lesser thickness 105t (e.g., 10 angstroms, 50 angstroms, etc.). If process constraints so require, first layer 105 can also have a thickness 105t that exceeds 200 angstroms.

Materials of First and Second Layers

In one embodiment, for example, a material composition of first layer 105 includes polysilicon germanium (poly-SiGe). The poly-SiGe first layer 105 is deposited, such as by chemical vapor deposition (CVD) to an as-deposited thickness of approximately 400 angstroms. One embodiment uses low-pressure chemical vapor deposition (LPCVD) by pyrolysis of $SiH_4$ and $GeH_4$ at a temperature as low as approximately 400 degrees Celsius. For example, see T. J. King et al., "Deposition and Properties of Low-Pressure Chemical-Vapor Deposited Polycrystalline Silicon-Germanium Films," *J. Electrochemical Soc.*, Vol. 141, No. 8, pp. 2235–41, August 1994, which is incorporated herein by reference. The poly-SiGe first layer 105 is strongly absorptive to UV and DUV wavelengths of incident light 120.

In one embodiment, second layer 110 includes an oxide that is grown by oxidizing the poly-SiGe first layer 105. In one example, second layer 110 is formed by oxidizing the poly-SiGe first layer 105 using electron cyclotron resonance (ECR) plasma at a low temperature (e.g., as low as room temperature of approximately 25 degrees Celsius). For example, see P. W. Li et al., "Formation of stoichiometric SiGe oxide by electron cyclotron resonance plasma," *Applied Physics Letters*, Vol. 60, No. 26, pp. 3265–67, June 1992, which is incorporated herein by reference. Alternatively, second layer 110 is formed by oxidizing the poly-SiGe first layer 105 using non-ECR mode microwave plasma at a low temperature (e.g., approximately between 200 degrees Celsius and 300 degrees Celsius). In one Embodiment, the resulting thickness 105t of second layer 110 is approximately less than 425 angstroms, leaving a thickness 105t of approximately 200 angstroms of underlying poly-SiGe first layer 105.

As described above, the exact thickness 110t of second layer 110 is selected to match the optical impedances $Z_{110}$, of second layer 110, and $Z_{115}$, of photoresist layer 115. Since the thickness 110t is determined by the oxidation step forming second layer 110, it is relatively easy to control. Accordingly, the present invention provides a more precisely controlled thickness 110t, thereby better matching the optical impedances $Z_{110}$ and $Z_{115}$. By contrast, a more conventional technique that deposits layers to form the antireflective coating would not provide such a well-controlled thickness 110t for precisely matching optical impedances $Z_{110}$ and $Z_{115}$.

Moreover, since the above-described steps of forming first layer 105 and second layer 110 are carried out at low temperatures, they are capable of use in conjunction with low thermal budget materials (e.g., aluminum or other metals) formed on substrate 100. By contrast, using a more conventional oxidation technique to form second layer 110 would require a high temperature process step that would be incompatible with an underlying layer of aluminum, another metal, or any other material that is sensitive to subsequent high temperature processing.

In an alternative embodiment, for example, first layer 105 includes polycrystalline silicon (poly-Si), which is also strongly absorptive to UV and DUV wavelengths of incident light 120. In this embodiment, second layer 110 includes silicon dioxide ($SiO_2$). The poly-Si first layer 105 is deposited, such as by chemical vapor deposition (CVD) to an as-deposited thickness of approximately 400 angstroms. Second layer 110 includes an oxide that is grown by oxidizing the poly-Si first layer 105 at low temperatures. One example uses electron cyclotron resonance (ECR) plasma oxidation, as described above. Another example uses non-ECR mode microwave plasma at a low temperature (e.g., approximately between 200 degrees Celsius and 300 degrees Celsius), as described above. In one embodiment, the resulting thickness 110t of second layer 110 is approximately less than 425 angstroms, leaving a thickness 105t of approximately 200 angstroms of underlying poly-Si first layer 105. This embodiment also provides precise control of thickness 110t for better matching optical impedances $Z_{110}$ and $Z_{115}$, and low temperature processing that is capable of use with underlying aluminum, metal, or other low thermal budget materials.

Though the above examples illustrate particular material compositions of each of first layer 105 and second layer 110, the present invention is understood to include, among other things, the use of any materials providing a strongly absorptive or low optical impedance first layer 105, the low temperature oxidation of which is used to grow second layer 110.

Conclusion

As described above, the present invention provides, among other things, an antireflective coating (ARC), such as for use in integrated circuit lithography. The antireflective coating is interposed between a photoresist layer and an underlying substrate. One aspect of the present invention matches an optical impedance at the interface between the antireflective coating and the photoresist, thereby minimizing reflections. The antireflective coating includes an optically absorptive first layer, and an optically transmissive overlying second layer. The second layer is formed by oxidizing the first layer at low temperatures. This provides better control over the thickness of the second layer, the effective optical impedance of the antireflective coating, and results in better matching between the second layer and photoresist optical impedances. This, in turn, minimizes reflections from the interface between the second and photoresist layers. Substantially all incident light is that reaches the first layer is absorbed therein. As a result, substantially no light reaches the potentially highly reflective underlying substrate.

The present invention reduces swing effect and notching, thereby allowing higher resolution photolithography and higher density integrated circuits. The present invention can be formed at low temperatures. As a result, the antireflective coating is particularly compatible with underlying aluminum or metal interconnection layers. Such layers are particularly reflective and have a low thermal budget. The present invention is also compatible with the ultraviolet (UV) and deep ultraviolet (DUV) photolithographic exposure wavelengths required for high resolution photolithography. Other advantages are also described in the above detailed description of the invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An antireflective coating for an integrated circuit substrate, comprising:
    a first layer of material arranged immediately adjacent the substrate and having an optical impedance and a thickness such that light entering the first layer is substantially absorbed; and
    a second layer atop the first layer and comprising an oxide formable from the first layer of material and having a second optical impedance.

2. The antireflective coating of claim 1, in which the second optical impedance exceeds the first optical impedance.

3. The antireflective coating of claim 1, wherein the first layer comprises polysilicon and the second layer comprises an oxide of germanium.

4. The antireflective coating of claim 1, wherein the first layer comprises polysilicon and the second layer comprises an oxide of silicon.

5. A coating for an integrated circuit substrate, comprising:
    a first layer of polysilicon-based material arranged immediately adjacent the substrate and having an optical impedance and a thickness such that light entering the first layer is substantially absorbed;
    a second layer comprising an oxide of the polysilicon-based material, the second layer arranged immediately adjacent the first layer and having a second optical impedance; and
    a layer of photoresist arranged atop the second layer and having a third optical impedance.

6. The coating of claim 5, wherein the third optical impedance is substantially matched to the second optical impedance.

7. The coating of claim 6, wherein the second and third optical impedances are each complex valued with real and imaginary parts, and wherein the real part of the second optical impedance matches the real part of the third optical impedance, and where the imaginary part of the of the second optical impedance matches the imaginary part of the third optical impedance.

8. The coating of claim 5, wherein the second layer has a thickness that is less than or equal to one fourth of the wavelength of the light entering the first layer.

9. An antireflective coating for an integrated circuit substrate, comprising:
    a first layer arranged atop the substrate, the first layer comprising polysilicon;
    a second layer of oxide formable from the polysilicon and arranged atop the first layer, the second layer being substantially transparent to a wavelength of light; and
    wherein the first layer is adapted to absorb an amount of the light having passed through the second oxide layer so as to prevent a substantial portion of light from reflecting from the integrated circuit substrate back through to the second oxide layer.

10. The antireflection coating of claim 9, wherein the wavelength of light is ultraviolet or deep ultraviolet.

11. The antireflection coating of claim 9, wherein the second layer supports a photoresist layer having a photoresist optical impedance.

12. The antireflection coating of claim 9, wherein the second layer has an optical impedance that is substantially matched to the photoresist optical impedance.

13. The antireflection coating of claim 9, wherein the oxide comprises silicon dioxide.

14. The antireflection coating of claim 9, wherein the polysilicon includes germanium, and the oxide includes germanium.

15. An antireflection coating, comprising:
a first layer arranged on an upper surface of a substrate and comprising a first material absorptive of a wavelength of light, the first layer having a thickness designed so that a select amount of the light passing therethrough is absorbed; and
a second layer comprising an oxide of the first material and having a first optical impedance that is designed to match an optical impedance of a photoresist layer to be received atop the second layer.

16. The antireflection coating of claim 15, further comprising the photoresist layer received atop the second layer.

17. The antireflection coating of claim 15, wherein the first material comprises polysilicon germanium and the second layer includes an oxide of germanium.

18. The antireflection coating of claim 17, wherein the first layer has a thickness of approximately 200 angstroms.

19. The antireflection coating of claim 15, wherein the first layer material comprises polysilicon and the second layer comprises an oxide of silicon.

20. The antireflection coating of claim 19, wherein the first layer has a thickness of approximately 200 angstroms.

21. The antireflection coating of claim 15, wherein the substrate is an integrated circuit substrate.

22. The antireflection coating of claim 21, wherein the substrate surface is highly reflective to the wavelength of light.

23. The antireflection coating of claim 15, wherein the thickness of the first layer is designed to absorb substantially all the light entering the first layer.

24. An antireflective coating for a substrate used in integrated circuit lithography, comprising:
a first layer of material formed atop the substrate, the first layer being absorptive to a wavelength of light passing through a second layer formed atop the first layer; and
wherein the second layer comprises an oxide of the material of the first layer and has a thickness designed to provide a first optical impedance that substantially matches a photoresist optical impedance of a photoresist layer to be received upon the second layer.

25. The antireflective coating of claim 24, wherein the first layer comprises polycrystalline silicon and the second layer comprises silicon dioxide.

26. The antireflective coating of claim 24, wherein the first layer comprises polycrystalline silicon and the second layer includes germanium dioxide.

27. An antireflective coating, comprising:
a first layer of polysilicon-based material formed on an upper surface of a substrate, the material being absorptive to ultraviolet and/or deep ultraviolet light; and
a second layer of an oxide of the polysilicon-based material formed atop the first layer and substantially transparent to the ultraviolet and/or deep ultraviolet light.

28. The coating of claim 27, wherein the polysilicon-based material consists only of polysilicon and the second layer comprises silicon dioxide.

29. The coating of claim 27, wherein the polysilicon-based material includes germanium polysilicon, and the second layer includes an oxide of germanium.

30. A structure for performing patterning of a photoresist layer, comprising:
a first layer of material formed atop a semiconductor wafer, the first layer comprising a polysilicon-based material that absorbs a wavelength of light capable of exposing the photoresist;
a second layer of material comprising an oxide of the first material atop the first layer, the second layer having a first optical impedance;
wherein the photoresist layer resides atop the second layer and has a photoresist optical impedance that substantially matches the first optical impedance so as to minimize reflections from an interface between the second layer and photoresist layer; and
a mask layer atop the photoresist layer, the mask layer having regions that are transmissive to the wavelength of light and regions that are absorptive to the wavelength of light.

31. The structure of claim 30, wherein the polysilicon-based material is polysilicon, and the second layer comprises silicon dioxide.

32. The structure of claim 30, wherein the polysilicon-based material is polysilicon germanium, and the oxide comprises germanium dioxide.

* * * * *

UNITED STATES PATENT AND TRADEMARK OFFICE
CERTIFICATE OF CORRECTION

PATENT NO. : 6,365,333 B2
DATED : April 2, 2002
INVENTOR(S) : Forbes et al.

It is certified that error appears in the above-identified patent and that said Letters Patent is hereby corrected as shown below:

Column 1,
Line 12, after "related to" insert -- copending, --.

Column 2,
Line 37, after "budget" insert -- . --.
Line 49, after "In one" delete ".".

Column 6,
Line 13, after "one" insert -- aspect --.
Line 48, delete "Z∠" and insert -- $Z_{110}$ --, therefor.
Line 57, delete "tee" and insert -- the --, therefor.

Column 7,
Line 5, delete "Not" and insert -- 110t --, therefor.

Column 8,
Line 44, delete "105t" and insert -- 110t --, therefor.

Column 10,
Line 45, delete "part of the of the" and insert -- part of the --, therefor.

Signed and Sealed this

First Day of October, 2002

Attest:

Attesting Officer

JAMES E. ROGAN
Director of the United States Patent and Trademark Office